United States Patent
Liu et al.

(10) Patent No.: US 7,388,408 B2
(45) Date of Patent: Jun. 17, 2008

(54) PHASE-FREQUENCY DETECTOR CAPABLE OF REDUCING DEAD ZONE

(75) Inventors: Sen-You Liu, Taipei Hsien (TW); Pi-An Wu, Taipei Hsien (TW)

(73) Assignee: VIA Technologies Inc., Hsin-Tien, Taipei Hsien (TW)

( * ) Notice: Subject to any disclaimer, the term of this patent is extended or adjusted under 35 U.S.C. 154(b) by 0 days.

(21) Appl. No.: 11/616,031

(22) Filed: Dec. 26, 2006

(65) Prior Publication Data

US 2007/0268050 A1    Nov. 22, 2007

Related U.S. Application Data

(60) Provisional application No. 60/747,303, filed on May 16, 2006.

(51) Int. Cl.
*H03D 13/00* (2006.01)

(52) U.S. Cl. ............................ 327/12; 327/3; 327/40; 327/43

(58) Field of Classification Search ............. 327/2, 327/3, 5, 7, 8, 10, 12, 39–43, 45, 47, 49, 327/142, 145–146, 150, 155–156, 159, 162–163; 331/17, 25

See application file for complete search history.

(56) References Cited

U.S. PATENT DOCUMENTS

| | | | | |
|---|---|---|---|---|
| 5,963,058 A | * | 10/1999 | Thomas | 327/3 |
| 5,963,059 A | * | 10/1999 | Partovi et al. | 327/12 |
| 5,977,801 A | * | 11/1999 | Boerstler | 327/7 |
| 7,053,666 B2 | * | 5/2006 | Tak et al. | 327/3 |

* cited by examiner

*Primary Examiner*—N. Drew Richards
*Assistant Examiner*—An T. Luu
(74) *Attorney, Agent, or Firm*—Winston Hsu

(57) ABSTRACT

A phase-frequency detector generates output signals at a first and a second output end based on input signals received at a first and a second input end. The phase-frequency detector includes two latch circuits, two pulse generators, two inverting circuits, two sensing devices, and a reset control circuit. The sensing devices control the pulse generators based on signals received at corresponding first ends of the sensing devices. The inverting circuits generate signals to the first and second output ends of the phase-frequency detector based on signals received at corresponding first ends of the inverting circuits. The reset control circuit generates reset signals based on signals received at the first and second output ends of the phase-frequency detector.

20 Claims, 9 Drawing Sheets

PHASE-FREQUENCY DETECTOR CAPABLE OF REDUCING DEAD ZONE

CROSS REFERENCE TO RELATED APPLICATIONS

This application claims the benefit of U.S. Provisional Application No. 60/747,303, filed on May 16, 2006 and entitled "PHASE-FREQUENCY DETECTOR WITH PULSE-GENERATED INPUT", the contents of which are incorporated herein by reference.

BACKGROUND OF THE INVENTION

1. Field of the Invention

The present invention relates to a phase-frequency detector, and more particularly, to a phase-frequency detector capable of reducing dead zone.

2. Description of the Prior Art

In a prior art phase lock loop (PLL), a phase-frequency detector (PFD) is used for detecting the phase and frequency differences between an input signal and a feedback signal. Based on the results of the PFD, a charge pump, a loop filter and a voltage-controlled oscillator (VCO) is used for adjusting the operations of the PLL so that the phase and frequency of the feedback signal matches those of the input signal.

Reference is made to FIG. 1 for a functional diagram of a prior art PLL 100. The PLL 100 includes a PFD 110, a charge pump 120, a loop filter 130, a VCO 140, and a frequency divider 150. The PFD 110 detects the phase and frequency differences between clock signals $F_{IN}$ and $F_{REF}$ and generates corresponding output clock signals UP and DOWN. Based on the output clock signals UP and DOWN, it is determined whether the phase of the clock signal $F_{REF}$ needs to be adjusted in the forward or backward directions. Next, the charge pump 120 generates a corresponding control current signal for the loop filter 130 based on the output clock signals UP and DOWN. The loop filter 130 then generates a corresponding control voltage signal for the VCO 140 based on the control current signal. Last, the VCO 140 generates a corresponding output clock signal $F_{OUT}$ based on the control voltage signal. Meanwhile, the output clock signal $F_{OUT}$ is transmitted to the PFD 110 via the frequency divider 150. Based on the output clock signal $F_{OUT}$, the frequency divider 150 generates the clock signal $F_{REF}$ so that the frequency of the output clock signal $F_{OUT}$ is a multiple of the frequency of the clock signal $F_{REF}$. Therefore, the PLL 100 can adjusts the phase of the clock signal $F_{REF}$ until the phase and frequency of the clock signal $F_{IN}$ matches those of the clock signal $F_{REF}$.

Reference is made to FIG. 2 for a diagram illustrating the output signals of a prior art PFD. In FIG. 2, the vertical axis represents the voltage level $V_{AVG}$ corresponding to the average output signal of the prior art PFD ($V_{AVG}$ equals to the average value of the output clock signals UP and DOWN), and the horizontal axis represents the phase difference $\Delta\Phi$ between the clock signals $F_{IN}$ and $F_{REF}$. In the ideal case as illustrated in FIG. 2, the voltage $V_{AVG}$ corresponding to the average output signal of the prior art PFD 110 is proportional to the phase difference $\Delta\Phi$. However in actual operations, the PFD has two non-ideal output regions: dead-zone and blind-zone. Dead-zone occurs when the phase difference $\Delta\Phi$ between the clock signals $F_{IN}$ and $F_{REF}$ is very small. Under these circumstances, the signal rising edges of the clock signals $F_{IN}$ and $F_{REF}$ are very close to each other, and there may not be sufficient time for the output clock signals UP and DOWN to reach the voltage levels corresponding to the phase difference $\Delta\Phi$. Therefore, the control voltage signals generated by the charge pump 120 and the loop filter 130 are very small, and the PFD 110 may not be able to adjust the phase difference $\Delta\Phi$ between the clock signals $F_{IN}$ and $F_{REF}$ accurately. Blind-zone occurs when the phase difference $\Delta\Phi$ between the clock signals $F_{IN}$ and $F_{REF}$ is a multiple of $2\pi$. Under these circumstances, the reset of the PFD 110 is very close to the rising edge of the signals in the next period, and the PFD 110 may not be able to determine the exact value of the phase difference $\Delta\Phi$. A PFD capable of reducing dead-zone and blind-zone can provide good performance. It is also preferable for a PFD to use as few active devices as possible so as to reduce the noise in the PLL.

Reference is made to FIG. 3 for a functional diagram of a prior art PFD 300 using RS flip-flops. The PFD 300 includes two RS flip-flops 310, 320, and an AND gate 330. The RS flip-flops 310 and 320 are edge-triggered flip-flops in which a Q terminal generates corresponding outputs when the signals received at an R terminal and an S terminal are on the rising edge. The S terminals of the RS flip-flops 310 and 320 respectively receive the clock signals $F_{IN}$ and $F_{REF}$, the R terminals of the RS flip-flops 310 and 320 receive the reset signal $F_{RESET}$, and the Q terminals of the RS flip-flops 310 and 320 respectively generate the two output signals UP and DOWN of the PFD 300.

Reference is made to FIG. 4 for a diagram illustrating the tri-state operation of the prior art PFD 300. The PFD 300 has three operational states: (1) the output clock signals UP and DOWN both have a low logic level (logic 0); (2) the output clock signal UP has a low logic level and the output clock signal DOWN has a high logic level (logic 1); and (3) the output clock signal UP has a high logic level and the output clock signal DOWN has a low logic level. When the output clock signals UP and DOWN both have a low logic level, the PFD 300 switches to another operational state in which the output clock signal UP has a high logic level and the output clock signal DOWN has a low logic level upon detecting the signal rising edge of the clock signal $F_{IN}$. Meanwhile, the PFD 300 switches back to the original operational state in which the output clock signals UP and DOWN both have a low logic level upon detecting the rising edge of the clock signal $F_{REF}$. Similarly, when the output clock signals UP and DOWN both have a low logic level, the PFD 300 switches to another operational state in which the output clock signal UP has a low logic level and the output clock signal DOWN has a high logic level upon detecting the rising edge of the clock signal $F_{REF}$. Meanwhile, the PFD 300 switches back to the original operational state in which the output clock signals UP and DOWN both have a low logic level upon detecting the rising edge of the clock signal $F_{IN}$.

Reference is made to FIG. 5 for a circuit diagram of a prior art PFD 500. The PFD 500 includes two pulse generators 512 and 522, two latch circuit 514 and 524, a reset control circuit 510, and inverters 51 and 52. The PFD 500 respectively receives the clock signals $F_{IN}$ and $F_{REF}$ at a first input end and a second input end, and respectively generates the output clock signals UP and DOWN at a first output end and a second output end.

The latch circuits 514 and 524 respectively include inverters 53, 54 and inverters 55, 56. The input end and the output end of the inverter 53 are respectively coupled to the output end and the input end of the inverter 54. The input end and the output end of the inverter 55 are respectively coupled to the output end and the input end of the inverter 56. Therefore, the latch circuits 514 and 524 can provide voltages having a high logic level (logic 1) or a low logic level (logic 0) at the output end.

The reset control circuit 510 includes two P-type metal-oxide semiconductor (PMOS) transistors $T_{RESET}$, Two N-type metal-oxide semiconductor (NMOS) transistors $T_{ISO}$, an NAND gate 50, and inverters 57, 58. When the output ends of the latch circuits 514 and 524 have a low logic level, the transistor $T_{ISO}$ is turned off and the latch circuits 514 and 524 are thus electrically isolated from the pulse generators 512 and 522, respectively. The two input ends of the NAND gate 50 are respectively coupled to the output ends of the latch circuits 514 and 524 via the inverters 57 and 58. When the output ends of the latch circuits 514 and 524 have a low logic level, the NAND gate 50 outputs a reset signal $F_{RESET}$ at the output end for turning on (short-circuiting) the transistor $T_{RESET}$. Therefore, the output ends of the latch circuits 514 and 524 are reset, thereby having a high logic level.

The pulse generators 512 and 522 each include two NMOS transistors $T_{START}$ and $T_{STOP}$, and respectively include inverters 59 and 60. The gates of the NMOS transistors $T_{START}$ in the pulse generators 512 and 522 are coupled to the first and second input ends of the PFD 500, respectively. The gates of the NMOS transistors $T_{STOP}$ in the pulse generators 512 and 522 are respectively coupled to the first and second input ends of the PFD 500 via the inverters 59 and 60 for detecting the clock signals $F_{IN}$ and $F_{REF}$. Since the inverters 59 and 60 are coupled between the gates of the transistors $T_{START}$ and $T_{STOP}$, the inverters 59 and 60 can provide signal delay for respectively controlling the clock signals generated by the pulse generators 512 and 522.

The prior art PFD 500 provides signal delay for controlling the clock signals generated by the pulse generators 512 and 522 using inverters so that the tri-state illustrated in FIG. 4 can be achieved. However, the intrinsic characteristics of each inverter may vary or deviate from its nominal value due to process variations. Therefore, the prior art PFD may not be able to function efficiently.

SUMMARY OF THE INVENTION

The present invention provides a phase-frequency detector capable of reducing dead zone and generating output signals at a first output end and a second output end based on input signals received at a first input end and a second input end. The phase-frequency detector comprises a first latch circuit, a second latch circuit, a reset control circuit, a first pulse generator, a second pulse generator, a first inverting circuit, a second inverting circuit, a first sensing device, and a second sensing device. The first latch circuit has a first end coupled to the first output end of the phase-frequency detector, and the second latch circuit has a first end coupled to the second output end of the phase-frequency detector. The reset control circuit is coupled to first ends of the first and second latch circuits and the first and second output ends of the phase-frequency detector for generating corresponding signals to the first ends of the first and second latch circuits based on voltage levels obtained at the first and second output ends of the phase-frequency detector. The first pulse generator comprises a first input end coupled to the first input end of the phase-frequency detector; a second input end; and an output end coupled to the second end of the first latch circuit. The second pulse generator comprises a first input end coupled to the second input end of the phase-frequency detector; a second input end; and an output end coupled to the second end of the second latch circuit. The first inverting circuit comprises an input end coupled to the first input end of the phase-frequency detector and an output end coupled to the second input end of the first pulse generator. The second inverting circuit comprises an input end coupled to the second input end of the phase-frequency detector and an output end coupled to the second input end of the second pulse generator. The first sensing device comprises a first end coupled to the second input end of the first pulse generator; a second end coupled to the first inverting circuit; and a control end coupled to the second or first end of the first latch circuit. The second sensing device comprises a first end coupled to the second input end of the second pulse generator; a second end coupled to the second inverting circuit; and a control end coupled to the second or first end of the second latch circuit.

The present invention also provides a phase-frequency detector capable of reducing dead zone and generating output signals at a first output end and a second output end based on input signals received at a first input end and a second input end. The phase-frequency detector comprises a first latch circuit, a second latch circuit, a reset control circuit, a first pulse generator, a second pulse generator, a first inverting circuit, a second inverting circuit, a first sensing device, and a second sensing device. The first latch circuit comprises a first end coupled to the first output end of the phase-frequency detector. The second latch circuit comprises a first end coupled to the second output end of the phase-frequency detector. The reset control circuit is coupled to first ends of the first and second latch circuits and the first and second output ends of the phase-frequency detector for generating corresponding signals to the first ends of the first and second latch circuits based on voltage levels obtained at the first and second output ends of the phase-frequency detector. The first pulse generator comprises a first input end coupled to the first input end of the phase-frequency detector; a second input end; and an output end coupled to the second end of the first latch circuit. The second pulse generator comprises a first input end coupled to the second input end of the phase-frequency detector; a second input end; and an output end coupled to the second end of the second latch circuit. The first inverting circuit comprises an input end coupled to the first input end of the phase-frequency detector and an output end coupled to the second input end of the first pulse generator. The second inverting circuit comprises an input end coupled to the second input end of the phase-frequency detector and an output end coupled to the second input end of the second pulse generator. The first sensing device comprises a first end coupled to the second input end of the first pulse generator; a second end coupled to the first inverting circuit; and a control end coupled to the first end of the first latch circuit. The second sensing device comprises a first end coupled to the second input end of the second pulse generator; a second end coupled to the second inverting circuit; and a control end coupled to the first end of the second latch circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
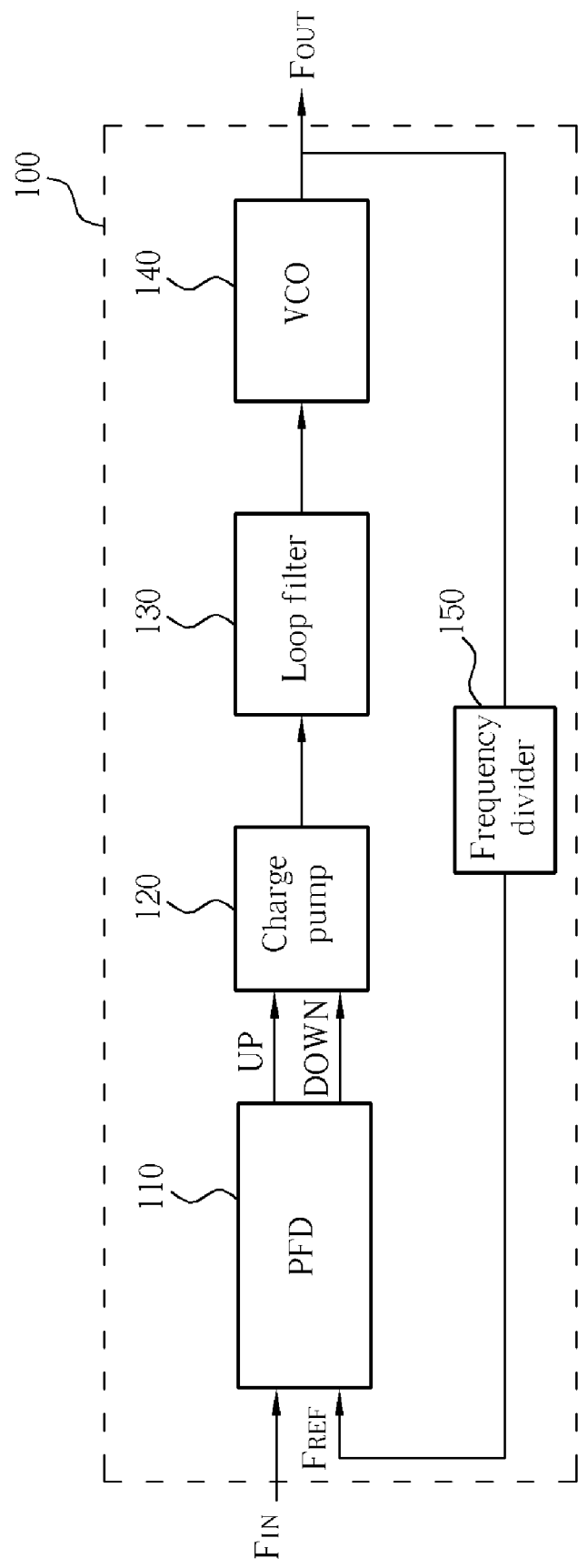
FIG. 1 is a functional diagram of a prior art PLL.
Figure 2:
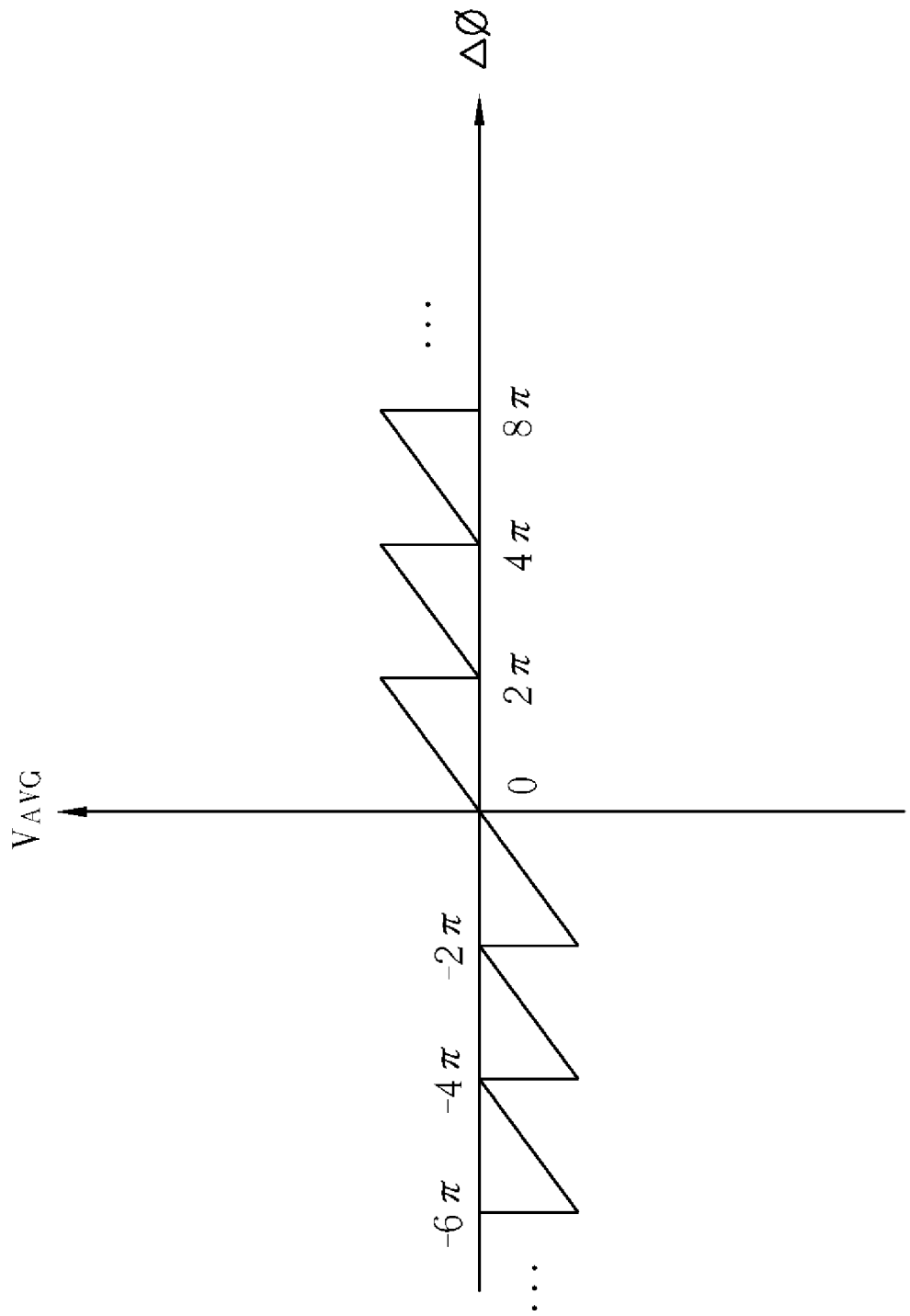
FIG. 2 is a diagram illustrating the output signals of a prior art PFD.
Figure 3:
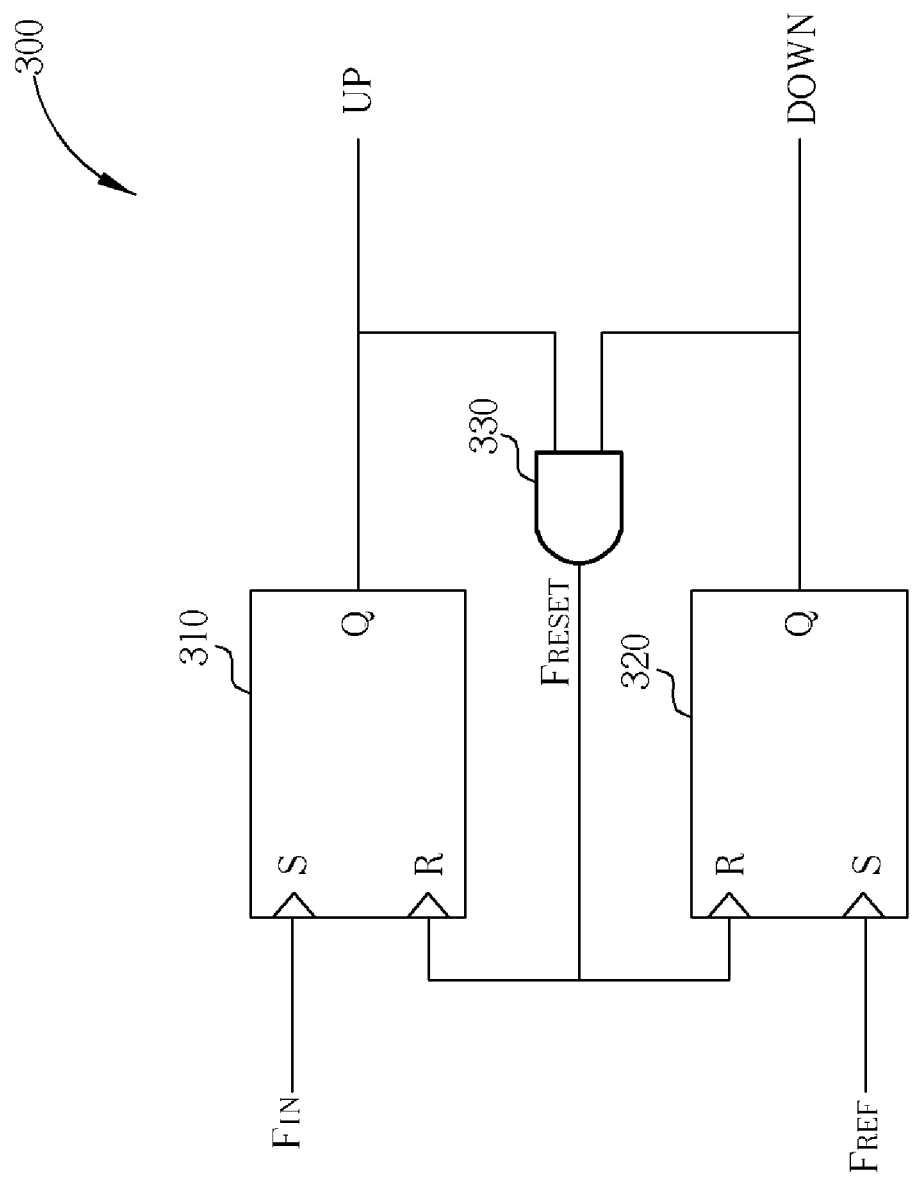
FIG. 3 is a functional diagram of a prior art PFD using RS flip-flops.
Figure 4:
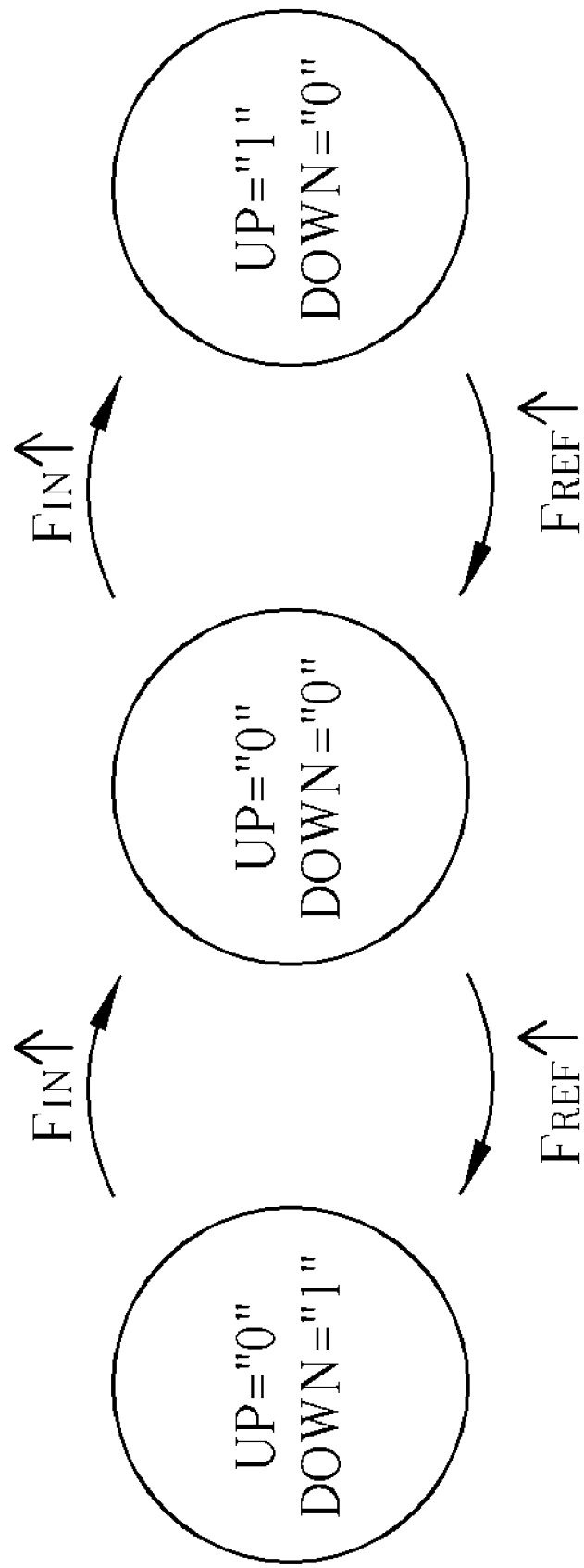
FIG. 4 is a diagram illustrating the tri-state operation of the prior art PFD in FIG. 3.
Figure 5:
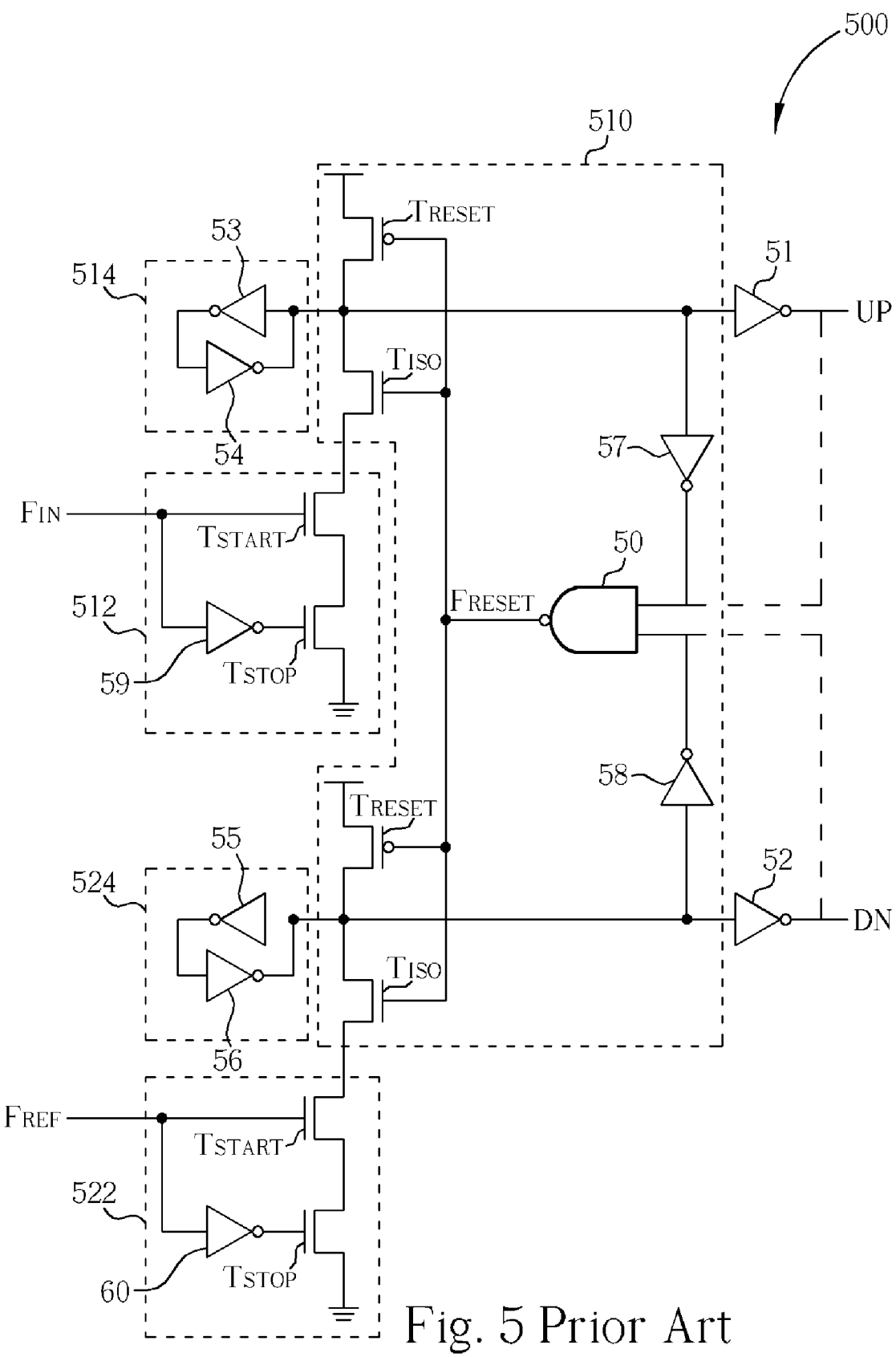
FIG. 5 is a circuit diagram of a prior art PFD.
Figure 6:
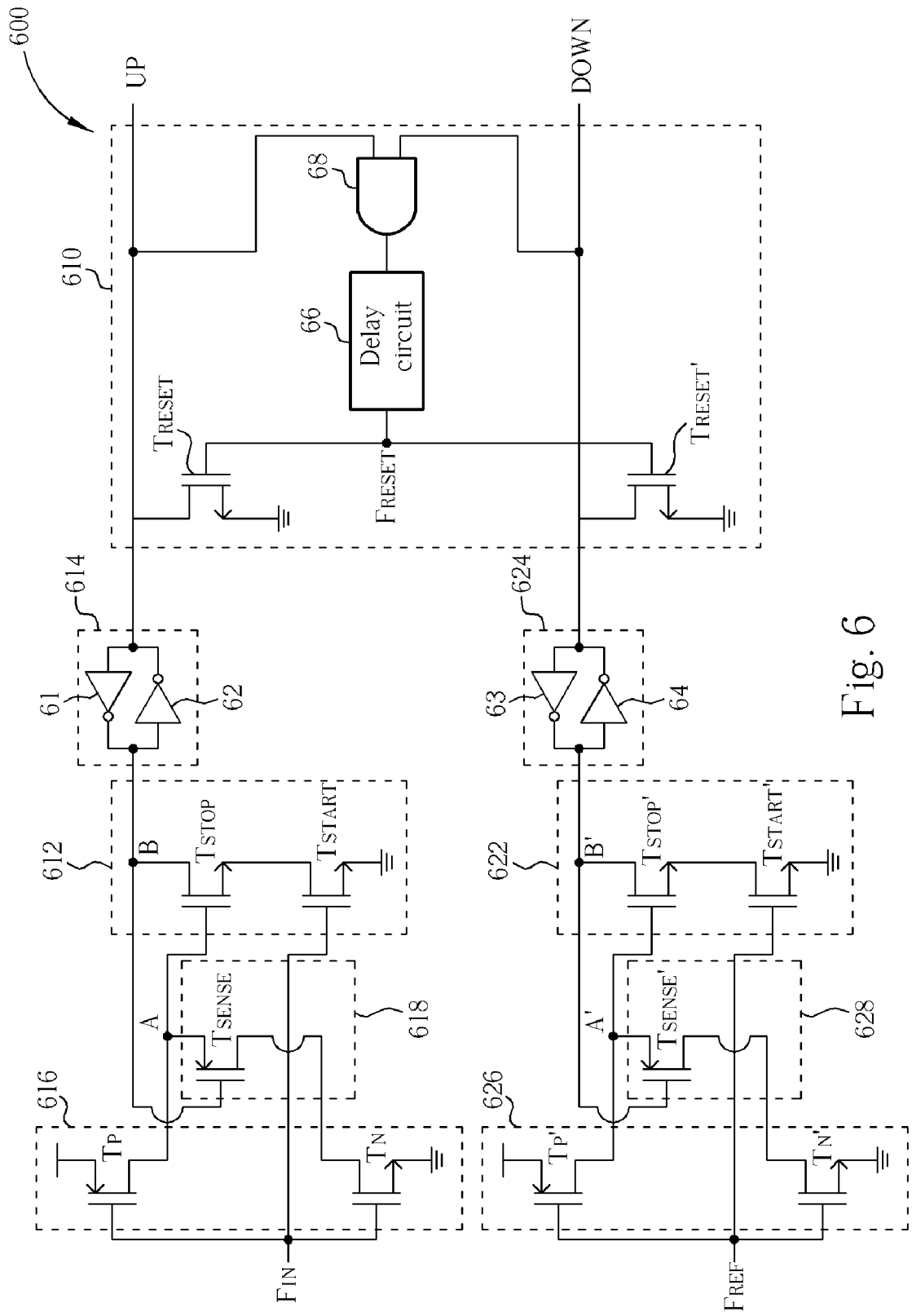
FIG. 6 is a circuit diagram of a PFD according to the present invention.

The present invention provides a PFD capable of reducing dead-zone. Reference is made to FIG. 6 for a circuit diagram of a PFD 600 according to the present invention. The PFD 600 includes two pulse generators 612 and 622, two latch circuits 614 and 624, two inverting circuits 616 and 626, two sensing devices 618 and 628, and a reset control circuit 610. The PFD 600 respectively receives the clock signals $F_{IN}$ and $F_{REF}$ at a first input end and a second input end, and respectively generates the output clock signals UP and DOWN at a first output end and a second output end.

First, the detail structure of each circuit in the PFD 600 is described. In the PFD 600, the inverting circuits 616 and 626 can form a complementary metal-oxide semiconductor (CMOS) transistor structure using PMOS and NMOS transistors. In the inverting circuit 616, the gates of the transistors $T_P$ and $T_N$ are coupled to each other as the input end of the inverting circuit 616, which is also coupled to the first input end of the PFD 600 for detecting the clock signal $F_{IN}$. Therefore, the transistors $T_P$ and $T_N$ of the inverting circuit 616 can be turned on or off based on the clock signal $F_{IN}$. Also, the sources of the transistors $T_P$ and $T_N$ in the inverting circuit 616 are both coupled to predetermined levels (such as respectively coupled to a positive voltage level and ground). The drains of the transistors $T_P$ and $T_N$ in the inverting circuit 616 are coupled to each other via the sensing device 618. Similarly, in the inverting circuit 626, the gates of the transistors $T_P'$ and $T_N'$ are coupled to each other as the input end of the inverting circuit 626, which is also coupled to the second input end of the PFD 600 for detecting the clock signal $F_{REF}$. Therefore, the transistors $T_P'$ and $T_N'$ of the inverting circuit 626 can be turned on or off based on the clock signal $F_{REF}$. Also, the sources of the transistors $T_P'$ and $T_N'$ in the inverting circuit 626 are both coupled to predetermined levels (such as respectively coupled to a positive voltage level and ground). The drains of the transistors $T_P'$ and $T_N'$ in the inverting circuit 626 are coupled to each other via the sensing device 628. The output ends of the inverting circuits 616 and 626 are respectively represented by "A" and "A'" in FIG. 6.

The pulse generators 612 and 622 each include two NMOS transistors. In the pulse generator 612, the gate of the transistor $T_{START}$, serving as the first input end of the pulse generator 612, is coupled to the first input end of the PFD 600 for receiving the clock signal $F_{IN}$. Also, the gate of the transistor $T_{STOP}$, serving as the second input end of the pulse generator 612, is coupled to the output end A of the inverting circuit 616. Meanwhile, the drain of the transistor $T_{START}$ and the source of the transistor $T_{STOP}$ are coupled to each other, while the source of the transistor $T_{START}$ is coupled to a predetermined voltage level (such as ground). The drain of the transistor $T_{STOP}$, serving as the output end of the pulse generator 612, is represented by "B" in FIG. 6. Similarly, in the pulse generator 622, the gate of the transistor $T_{START}'$, serving as the first input end of the pulse generator 622, is coupled to the second input end of the PFD 600 for receiving the clock signal $F_{REF}$. Also, the gate of the transistor $T_{STOP}'$, serving as the second input end of the pulse generator 622, is coupled to the output end A' of the inverting circuit 626. Meanwhile, the drain of the transistor $T_{START}'$ and the source of the transistor $T_{STOP}'$ are coupled to each other, while the source of the transistor $T_{START}'$ is coupled to a predetermined voltage level (such as ground). The drain of the transistor $T_{STOP}'$, serving as the output end of the pulse generator 622, is represented by "B'" in FIG. 6.

The reset control circuit 610 includes two reset transistors $T_{RESET}$ and $T_{RESET}'$, an AND gate 68, and a delay circuit 66. The reset transistors $T_{RESET}$ and $T_{RESET}'$ can include NMOS transistors having the drains respectively coupled to the first and second output ends of the PFD 600 for detecting the output clock signals UP and DOWN, and the sources both coupled to a predetermined voltage level (such as ground). The two input ends of the AND gate 68 are also coupled to the first and second output ends of the PFD 600 for detecting the output clock signals UP and DOWN, respectively. The delay circuit 66, coupled between the gates of the two reset transistors and the output end of the AND gate 68, can include an RC delay circuit formed by resistors and capacitors, or a plurality of inverters coupled in series.

Figure 9:
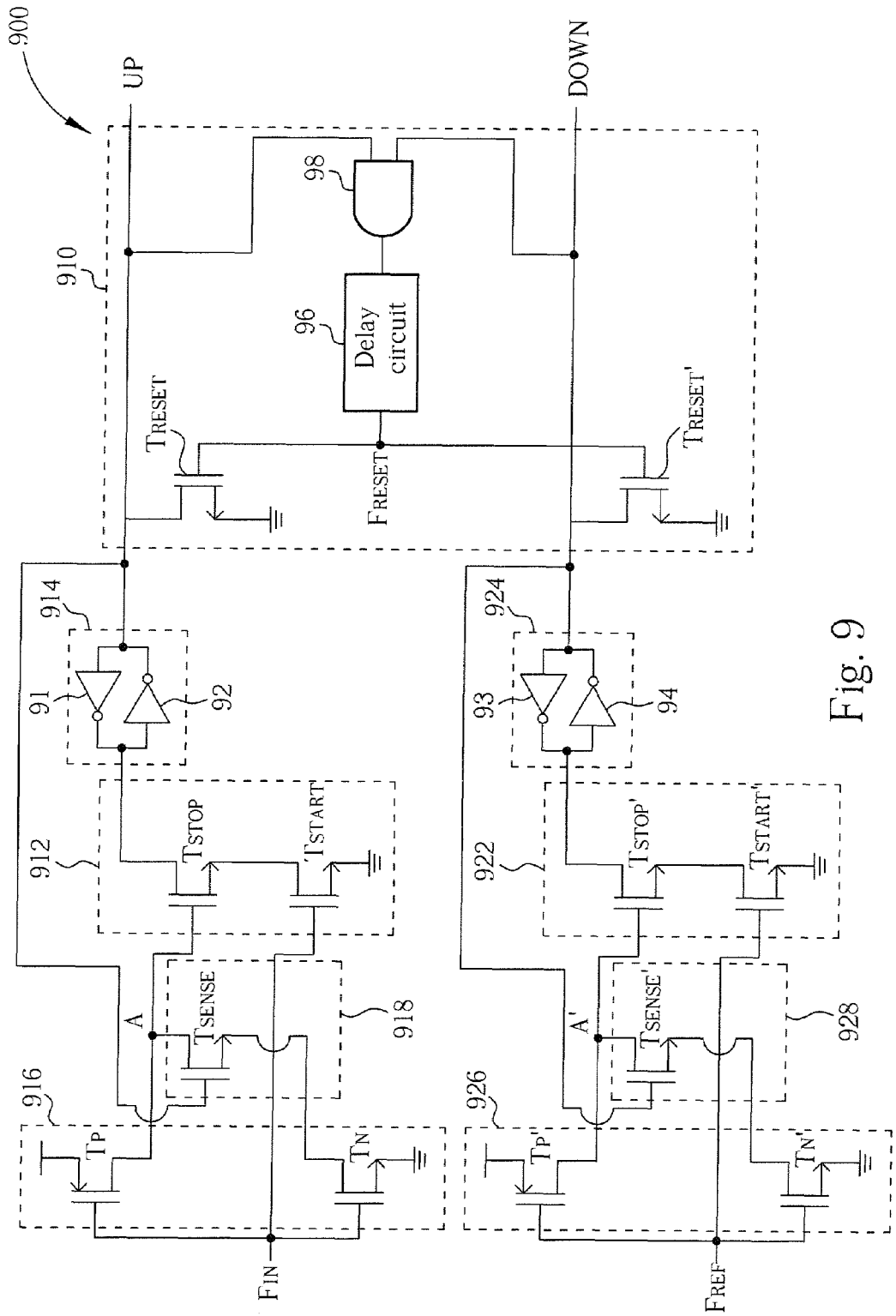
FIG. 9 is another embodiment of the circuit diagram of a PFD according to the present invention.

The first ends of the latch circuits 614 and 624 are respectively coupled to the output end B of the pulse generator 612 and the output end B' of the pulse generator 622. The second ends of the latch circuits 614 and 624 are respectively coupled to the first and second output ends of the PFD 600. The latch circuits 614 and 624 can operate in a predetermined state based on the voltage levels detected at the first and second ends. In this embodiment, the latch circuits 614 and 624 respectively include inverters 61, 62 and inverters 63, 64. The input end and the output end of the inverter 61 are respectively coupled to the output end and the input end of the inverter 62. The input end and the output end of the inverter 63 are respectively coupled to the output end and the input end of the inverter 64. When the latch circuits 614 and 624 operate in a first state, the first ends of the latch circuits 614 and 624 have a high logic level and the second ends of the latch circuits 614 and 624 have a low logic level. When the latch circuits 614 and 624 operate in a second state, the first ends of the latch circuits 614 and 624 have a low logic level and the second ends of the latch circuits 614 and 624 have a high logic level The sensing devices 618 and 628 respectively include a transistor $T_{SENSE}$ and a transistor $T_{SENSE}'$. The transistors $T_{SENSE}$ and $T_{SENSE}'$ can both be PMOS transistors or NMOS transistors. In the embodiment in the FIG. 6, the transistors $T_{SENSE}$ and $T_{SENSE}'$ are both PMOS transistors. In the FIG. 6, the transistors $T_{SENSE}$ and $T_{SENSE}'$ include PMOS transistors having the gates respectively coupled to the output end B of the pulse generator 612 and the output end B' of the pulse generator 622, the sources respectively coupled to the second input ends of the pulse generators 612 and 622, and the drains respectively coupled to the inverting circuits 616 and 626. In the FIG. 9, which is another embodiment of the circuit diagram of a PFD according to the present invention, the transistors $T_{SENSE}$ and $T_{SENSE}'$ are both NMOS transistors. In the FIG. 9, the transistors $T_{SENSE}$ and $T_{SENSE}'$ include NMOS transistors having the gates respectively coupled to the first and second output ends of the PFD 900, the drains respectively coupled to the second input ends of the pulse generators 912 and 922, and the sources respectively coupled to the inverting circuits 916 and 926.

Next, the operations of the PFD 600 is described. In the initial state, both the output clock signals UP and DOWN have a low voltage level, and both the output end B of the pulse generator 612 and the output end B' of the pulse generator 622 have a high voltage level. When the clock signal $F_{IN}$ is positively-triggered to a high voltage level, the transistor $T_P$ of the inverting circuit 616 is turned off and the transistor $T_N$ of the inverting circuit 616 is turned on. Under these circumstances, the transistors $T_{START}$ and $T_{STOP}$ are turned on simultaneously, while the transistor $T_{SENSE}$ remains off. Therefore, the voltage level obtained at the output end B of the pulse generator 612 is gradually pulled down by the turned-on transistors $T_{START}$ and $T_{STOP}$. When the voltage difference between the output end A of the inverting circuit 616 and the output end B of the pulse generator 612 becomes larger than the threshold voltage of the transistor $T_{SENSE}$, the transistor $T_{SENSE}$ is turned on and the voltage level obtained at the output end A of the inverting circuit 616 is gradually pulled down by the turned-on transistors $T_{SENSE}$ and $T_N$, thereby turning off the transistor $T_{STOP}$. At this point, the voltage level obtained at the output end B of the pulse generator 612 is no longer under the influence of the clock signal $F_{IN}$. After detecting the low voltage level obtained at the output end B, the latch circuit 614 outputs the output clock signal UP having a high level at the second end. Similarly, when the clock signal $F_{REF}$ is positively-triggered to a high voltage level, the transistor $T_P'$ of the inverting circuit 626 is turned off and the transistor $T_N'$ of the inverting circuit 626 is turned on. Under these circumstances, the transistors $T_{START}'$ and $T_{STOP}'$ are turned on simultaneously, while the transistor $T_{SENSE}'$ remains off. Therefore, the voltage level obtained at the output end B' of the pulse generator 622 is gradually pulled down by the turned-on transistors $T_{START}'$ and $T_{STOP}'$. When the voltage difference between the output end A' of the inverting circuit 626 and the output end B' of the pulse generator 622 becomes larger than the threshold voltage of the transistor $T_{SENSE}'$, the transistor $T_{SENSE}'$ is turned on and the voltage level obtained at the output end A' of the inverting circuit 626 is gradually pulled down by the turned-on transistors $T_{SENSE}'$ and $T_N'$, thereby turning off the transistor $T_{STOP}'$. At this point, the voltage level obtained at the output end B' of the pulse generator 622 is no longer under the influence of the clock signal $F_{REF}$. After detecting the low voltage level obtained at the output end B', the latch circuit 624 outputs the output clock signal DOWN having a high level at the second end.

When the output clock signals UP and DOWN both have a high logic level, the output end of the AND gate 68 sends the reset signal $F_{RESET}$ having a high logic level, which is then transmitted to the gates of the reset transistors $T_{RESET}$ and $T_{RESET}'$ via the delay circuit 66. Therefore, the reset transistors $T_{RESET}$ and $T_{RESET}'$ are turned on and the voltage levels at the drains of the reset transistors $T_{RESET}$ and $T_{RESET}'$ are lowered, which thus resets the output clock signals UP and DOWN to a low logic level. When the second ends of the latch circuits 614 and 624 respectively detect the output clock signals UP and DOWN both having a low logic level, signals having a high logic level are respectively sent at the first ends of the latch circuits 614 and 624, thereby resetting the output end B of the pulse generator 612 and the output end B' of the pulse generator 622 to a high voltage level.

Figure 7:
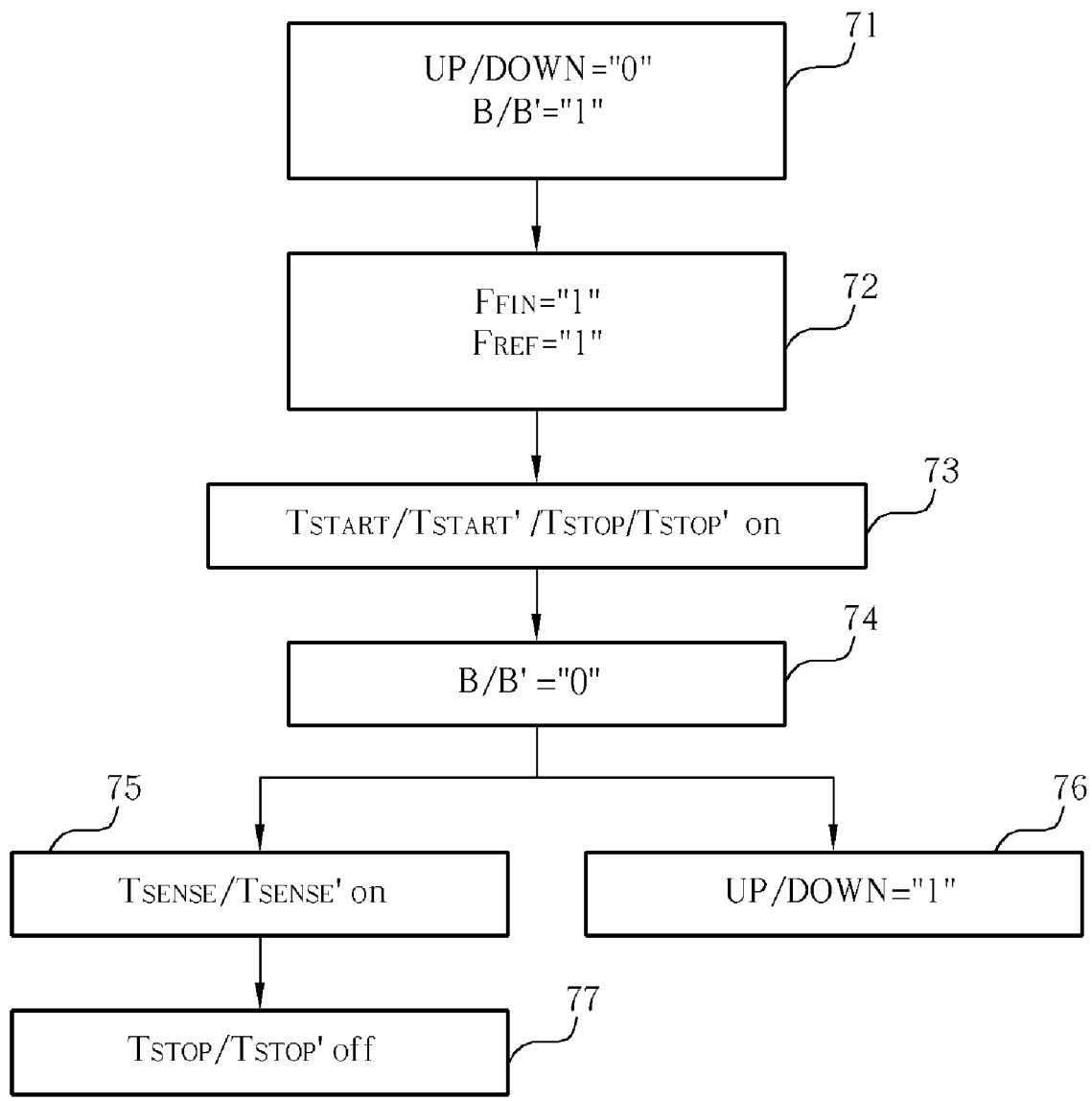
FIG. 7 is a state diagram illustrating the operation of the pulse generators according to the present invention.

Reference is made to FIG. 7 for a state diagram illustrating the operations of the pulse generators 612 and 622 according to the present invention. State 71 represents the initial state of the pulse generators 612 and 622 in which the output clock signals UP and DOWN both have a low voltage level, and the output end B of the pulse generator 612 and the output end B' of the pulse generator 622 both have a high voltage level. After positive trigger, the clock signals $F_{FIN}$ and $F_{REF}$ both have a high voltage level, as illustrated by state 72. Next, the transistors $T_{START}$, $T_{STOP}$, $T_{START}'$ and $T_{STOP}'$ are turned on, thereby pulling the output end B of the pulse generator 612 and the output end B' of the pulse generator 622 both to a low voltage level, as respectively illustrated by states 73 and 74. When the output end B of the pulse generator 612 and the output end B' of the pulse generator 622 both have a low voltage level, the transistors $T_{SENSE}$ and $T_{SENSE}'$ are turned on, thereby pulling the output clock signals UP and DOWN both to a high voltage level, as respectively illustrated by states 75 and 76. Also, after the transistors $T_{SENSE}$ and $T_{SENSE}'$ are turned on, the transistors $T_{STOP}$ and $T_{STOP}'$ are turned off, as illustrated by state 77.

Figure 8:
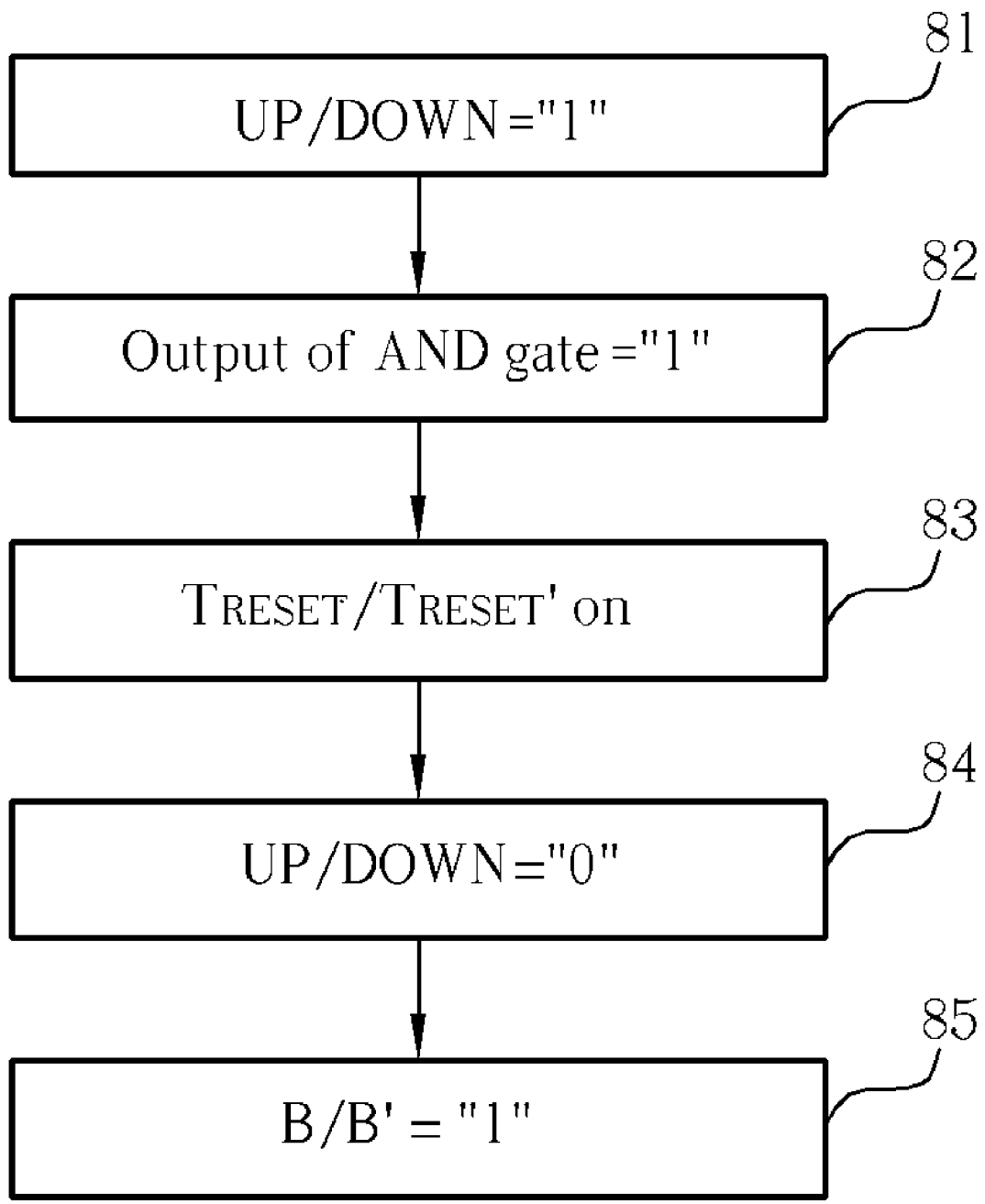
FIG. 8 is a state diagram illustrating the operation of the reset control circuit according to the present invention.

Reference is made to FIG. 8 for a state diagram illustrating the operations of the reset control circuit 610 according to the present invention. State 81 represents the initial state of the reset control circuit 610 in which the output clock signals UP and DOWN both have a high voltage level. After detecting the output clock signals UP and DOWN both having a high voltage level, the output end of the AND gate 68 has a high voltage level, as illustrated by state 82. Next, the reset transistors $T_{RESET}$ and $T_{RESET}'$ are turned on, thereby pulling the output clock signals UP and DOWN both to a low voltage level, as respectively illustrated by states 83 and 84. Finally, the output end B of the pulse generator 612 and the output end B' of the pulse generator 622 are both pulled to a high voltage level, as illustrated by state 85. Under these circumstances, the PFD 600 returns to the initial state, as illustrated by state 71 in FIG. 7.

In the PFD 600 according to the present invention, the sensing devices 618 and 628 are used for detecting the voltage levels obtained at the output ends B and B'. Therefore, the transistors $T_{STOP}$ and $T_{STOP}'$ can be turned off with accurate control and the pulse generators 612 and 622 can operate efficiently. Meanwhile, when the output clock signals UP and DOWN both have a high voltage level, the AND gate 68 sends the reset signal $F_{RESET}$ via the delay circuit 66 so that the output clock signals UP and DOWN can remain at a high voltage level for a certain period of time. As a result, dead-zone of the PFD 600 can be reduced since each device has sufficient reaction time before the PFD 600 receives the clock signals $F_{REF}$ and $F_{REF}'$ of the next period.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A phase-frequency detector capable of reducing dead zone and generating output signals at a first output end and a second output end based on input signals received at a first input end and a second input end, the phase-frequency detector comprising:
   a first latch circuit having a first end coupled to the first output end of the phase-frequency detector;
   a second latch circuit having a first end coupled to the second output end of the phase-frequency detector;
   a reset control circuit coupled to first ends of the first and second latch circuits and the first and second output ends of the phase-frequency detector for generating corresponding signals to the first ends of the first and second latch circuits based on voltage levels obtained at the first and second output ends of the phase-frequency detector;
   a first pulse generator comprising:
      a first input end coupled to the first input end of the phase-frequency detector;
      a second input end; and
      an output end coupled to the second end of the first latch circuit;
   a second pulse generator comprising:
      a first input end coupled to the second input end of the phase-frequency detector;
      a second input end; and an output end coupled to the second end of the second latch circuit;
a first inverting circuit comprising:
an input end coupled to the first input end of the phase-frequency detector; and
an output end coupled to the second input end of the first pulse generator;
a second inverting circuit comprising:
an input end coupled to the second input end of the phase-frequency detector; and
an output end coupled to the second input end of the second pulse generator;
a first sensing device comprising:
a first end coupled to the second input end of the first pulse generator;
a second end coupled to the first inverting circuit; and
a control end coupled to the second end of the first latch circuit; and
a second sensing device comprising:
a first end coupled to the second input end of the second pulse generator;
a second end coupled to the second inverting circuit; and
a control end coupled to the second end of the second latch circuit.

2. The phase-frequency detector of claim 1 wherein:
the first latch circuit comprises:
a first inverter having an input end coupled to the first end of the first latch circuit and an output end coupled to the second end of the first latch circuit; and
a second inverter having an input end coupled to the output end of the first inverter and an output end coupled to the input end of the first inverter; and
the second latch circuit comprises:
a third inverter having an input end coupled to the first end of the second latch circuit and an output end coupled to the second end of the second latch circuit; and
a fourth inverter having an input end coupled to the output end of the third inverter and an output end coupled to the input end of the third inverter.

3. The phase-frequency detector of claim 1 wherein:
the first pulse generator comprises:
a first N-type metal-oxide-semiconductor (NMOS) transistor having a gate coupled to the first input end of the first pulse generator; and
a second NMOS transistor including:
a gate coupled to the second input end of the first pulse generator;
a source coupled to a drain of the first NMOS transistor; and
a drain coupled to the output end of the first pulse generator; and
the second pulse generator comprises:
a third NMOS transistor having a gate coupled to the first input end of the second pulse generator; and
a fourth NMOS transistor including:
a gate coupled to the second input end of the second pulse generator;
a source coupled to a drain of the third NMOS transistor; and
a drain coupled to the output end of the second pulse generator.

4. The phase-frequency detector of claim 3 wherein the first and third NMOS transistors each further comprise a source coupled to ground.

5. The phase-frequency detector of claim 1 wherein:
the first sensing device comprises a first P-type metal-oxide-semiconductor (PMOS) transistor including:
a gate coupled to the control end of the first sensing device;
a source coupled to the first end of the first sensing device; and
a drain coupled to the second end of the first sensing device; and
the second sensing device comprises a second PMOS transistor including:
a gate coupled to the control end of the second sensing device;
a source coupled to the first end of the second sensing device; and
a drain coupled to the second end of the second sensing device.

6. The phase-frequency detector of claim 1 wherein the first and second inverting circuits each include an inverter having a complimentary metal-oxide-semiconductor (CMOS) transistor structure.

7. The phase-frequency detector of claim 1 wherein the reset control circuit comprises:
an NAND gate having a first input end and a second input end respectively coupled to the first output end and the second output end of the phase-frequency detector;
a first reset NMOS transistor including:
a gate coupled to an output end of the NAND gate;
a drain coupled to the first end of the first latch circuit; and
a source coupled to a bias voltage; and
a second reset NMOS transistor including:
a gate coupled to the output end of the NAND gate;
a drain coupled to the first end of the second latch circuit; and
a source coupled to a bias voltage.

8. The phase-frequency detector of claim 7 wherein the sources of the first and second reset NMOS transistors are coupled to ground.

9. The phase-frequency detector of claim 7 wherein the reset control circuit further includes a delay device coupled between the gates of the first and second reset NMOS transistors and the output end of the NAND gate.

10. A phase-frequency detector capable of reducing dead zone and generating output signals at a first output end and a second output end based on input signals received at a first input end and a second input end, the phase-frequency detector comprising:
a first latch circuit having a first end coupled to the first output end of the phase-frequency detector;
a second latch circuit having a first end coupled to the second output end of the phase-frequency detector;
a reset control circuit coupled to first ends of the first and second latch circuits and the first and second output ends of the phase-frequency detector for generating corresponding signals to the first ends of the first and second latch circuits based on voltage levels obtained at the first and second output ends of the phase-frequency detector;
a first pulse generator comprising:
a first input end coupled to the first input end of the phase-frequency detector;
a second input end; and
an output end coupled to the second end of the first latch circuit;
a second pulse generator comprising:
a first input end coupled to the second input end of the phase-frequency detector;

a second input end; and
an output end coupled to the second end of the second latch circuit;
a first inverting circuit comprising:
an input end coupled to the first input end of the phase-frequency detector; and
an output end coupled to the second input end of the first pulse generator;
a second inverting circuit comprising:
an input end coupled to the second input end of the phase-frequency detector; and
an output end coupled to the second input end of the second pulse generator;
a first sensing device comprising:
a first end coupled to the second input end of the first pulse generator;
a second end coupled to the first inverting circuit; and
a control end coupled to the first end of the first latch circuit; and
a second sensing device comprising:
a first end coupled to the second input end of the second pulse generator;
a second end coupled to the second inverting circuit; and
a control end coupled to the first end of the second latch circuit.

11. The phase-frequency detector of claim 10 wherein:
the first latch circuit comprises:
a first inverter having an input end coupled to the first end of the first latch circuit and an output end coupled to the second end of the first latch circuit; and
a second inverter having an input end coupled to the output end of the first inverter and an output end coupled to the input end of the first inverter; and
the second latch circuit comprises:
a third inverter having an input end coupled to the first end of the second latch circuit and an output end coupled to the second end of the second latch circuit; and
a fourth inverter having an input end coupled to the output end of the third inverter and an output end coupled to the input end of the third inverter.

12. The phase-frequency detector of claim 10 wherein:
the first pulse generator comprises:
a first N-type metal-oxide-semiconductor (NMOS) transistor having a gate coupled to the first input end of the first pulse generator; and
a second NMOS transistor including:
a gate coupled to the second input end of the first pulse generator;
a source coupled to a drain of the first NMOS transistor; and
a drain coupled to the output end of the first pulse generator; and
the second pulse generator comprises:
a third NMOS transistor having a gate coupled to the first input end of the second pulse generator; and
a fourth NMOS transistor including:
a gate coupled to the second input end of the second pulse generator;
a source coupled to a drain of the third NMOS transistor; and
a drain coupled to the output end of the second pulse generator.

13. The phase-frequency detector of claim 12 wherein the first and third NMOS transistors each further comprise a source coupled to ground.

14. The phase-frequency detector of claim 10 wherein:
the first sensing device comprises a first N-type metal-oxide-semiconductor (NMOS) transistor including:
a gate coupled to the control end of the first sensing device;
a drain coupled to the first end of the first sensing device; and
a source coupled to the second end of the first sensing device; and
the second sensing device comprises a second NMOS transistor including:
a gate coupled to the control end of the second sensing device;
a drain coupled to the first end of the second sensing device; and
a source coupled to the second end of the second sensing device.

15. The phase-frequency detector of claim 10 wherein the first and second inverting circuits each include an inverter having a complimentary metal-oxide-semiconductor (CMOS) transistor structure.

16. The phase-frequency detector of claim 10 wherein the reset control circuit comprises:
an NAND gate having a first input end and a second input end respectively coupled to the first output end and the second output end of the phase-frequency detector;
a first reset NMOS transistor including:
a gate coupled to an output end of the NAND gate;
a drain coupled to the first end of the first latch circuit; and
a source coupled to a bias voltage; and
a second reset NMOS transistor including:
a gate coupled to the output end of the NAND gate;
a drain coupled to the first end of the second latch circuit; and
a source coupled to a bias voltage.

17. The phase-frequency detector of claim 16 wherein the sources of the first and second reset NMOS transistors are coupled to ground.

18. The phase-frequency detector of claim 16 wherein the reset control circuit further includes a delay device coupled between the gates of the first and second reset NMOS transistors and the output end of the NAND gate.

19. The phase-frequency detector of claim 18 wherein the delay device includes a delay circuit composed of a resistor and a capacitor.

20. The phase-frequency detector of claim 18 wherein the delay device includes a plurality of inverters coupled in series.

* * * * *